US009148193B2

(12) United States Patent
Yoshida

(10) Patent No.: US 9,148,193 B2
(45) Date of Patent: Sep. 29, 2015

(54) WIRELESS TRANSCEIVER AND METHOD OF SETTING OPERATING FREQUENCY

(71) Applicant: JVCKENWOOD CORPORATION, Yokohama (JP)

(72) Inventor: Toshimasa Yoshida, Yokohama (JP)

(73) Assignee: JVCKENWOOD CORPORATION (JP)

( * ) Notice: Subject to any disclaimer, the term of this patent is extended or adjusted under 35 U.S.C. 154(b) by 121 days.

(21) Appl. No.: 13/942,987

(22) Filed: Jul. 16, 2013

(65) Prior Publication Data
US 2014/0045440 A1    Feb. 13, 2014

(30) Foreign Application Priority Data

Aug. 9, 2012    (JP) .................................. 2012-177386

(51) Int. Cl.
*H04B 1/40*        (2015.01)
*H04B 1/401*       (2015.01)
*G01R 29/08*       (2006.01)

(52) U.S. Cl.
CPC ............ *H04B 1/401* (2013.01); *G01R 29/0871* (2013.01)

(58) Field of Classification Search
CPC ....................................................... H04B 1/401
USPC ............................................ 455/73, 77, 90.2
See application file for complete search history.

(56) References Cited

U.S. PATENT DOCUMENTS

| 8,676,273 | B1 * | 3/2014 | Fujisaki ........................ 455/567 |
| 2004/0268233 | A1 * | 12/2004 | Okumura et al. ............. 715/513 |
| 2007/0132761 | A1 * | 6/2007 | Maruyama et al. ........ 345/440.1 |

FOREIGN PATENT DOCUMENTS

JP    2004347320    12/2004

* cited by examiner

*Primary Examiner* — Tuan H Nguyen
(74) *Attorney, Agent, or Firm* — Cantor Colburn LLP

(57) ABSTRACT

The wireless transceiver includes: a liquid crystal display (LCD) which includes a display screen; an LCD control unit which controls the LCD to display a frequency distribution of a signal strength in a predetermined frequency range including an operating frequency on the display screen; a touch panel and a touch panel control unit which detect a manipulation of a user on the display screen; an operating frequency storage unit which stores reception frequency information corresponding to a reception frequency and transmission frequency information corresponding to a transmission frequency; and a control unit which updates the reception frequency information stored in the operating frequency storage unit or the transmission frequency information stored in the operating frequency storage unit based on information about a frequency corresponding to a manipulation location of the manipulation detected by the touch panel and the touch panel control unit.

11 Claims, 20 Drawing Sheets

WIRELESS TRANSCEIVER AND METHOD OF SETTING OPERATING FREQUENCY

CROSS-REFERENCE TO RELATED PATENT APPLICATIONS

This application claims the benefit of Japanese Patent Application No. 2012-177386, filed on Aug. 9, 2012, in the Japan Patent Office, the disclosure of which is incorporated herein in its entirety by reference.

BACKGROUND OF THE INVENTION

1. Field of the Invention

The present invention relates to a wireless transceiver and a method of setting an operating frequency.

2. Description of the Related Art

As a technology related to the prevent invention, in Patent Reference 1, a touch panel may be provided on a display screen of a spectrum analyzer so as to partially expand or scroll across a spectrum.

Generally, in a wireless transceiver capable of displaying a frequency distribution of signal strength of a reception signal on a display screen, a predetermined knob was rotated on the basis of the frequency distribution of the signal strength displayed on the display screen so as to adjust an operating frequency. Here, convenience of adjusting of an operating frequency needs to be improved.

However, since Patent Reference 1 is specialized in analyzing a signal, Patent Reference 1 does not contribute to improving the convenience of adjusting an operating frequency.

PRIOR ART REFERENCE (Patent Reference 1) Japanese Laid-Open Patent Publication No. 2004-347320

SUMMARY OF THE INVENTION

The present invention provides a technology for improving convenience of adjusting an operating frequency in a wireless transceiver.

According to an aspect of the present invention, there is provided a wireless transceiver which performs transmission and reception in an operating frequency wherein a transmission frequency and a reception frequency are the same or different, wherein the wireless transceiver includes: a display unit which has a display screen; a display control unit which controls the display unit to display a frequency distribution of a signal strength in a predetermined frequency range including the operating frequency on the display screen; a manipulation detection unit which detects a manipulation of a user on the display screen; a frequency information storage unit which stores reception frequency information corresponding to the reception frequency and transmission frequency information corresponding to the transmission frequency; an update unit which updates the reception frequency information stored in the frequency information storage unit or the transmission frequency information stored in the frequency information storage unit, on the basis of information about a frequency corresponding to a manipulation location of the manipulation detected by the manipulation detection unit; and a wireless transmission and reception unit which performs wireless transmission and reception, wherein the wireless transmission is performed by using the transmission frequency information stored in the frequency information storage unit and the wireless reception is performed by using the reception frequency information stored in the frequency information storage unit.

According to another aspect of the present invention, there is provided a method of setting an operating frequency of a wireless transceiver which performs transmission and reception in the operating frequency, wherein a transmission frequency and a reception frequency are the same or different, the method including: manipulating, by a user, a display screen on which a frequency distribution of a signal strength in a predetermined frequency range including the operating frequency is displayed; updating the reception frequency or the transmission frequency based on a frequency corresponding to a manipulation location of the manipulating; and performing reception in the updated reception frequency and transmission in the updated transmission frequency.

BRIEF DESCRIPTION OF THE DRAWINGS

The above and other features and advantages of the present invention will become more apparent by describing in detail exemplary embodiments thereof with reference to the attached drawings in which.

DETAILED DESCRIPTION OF THE INVENTION

Figure 1:
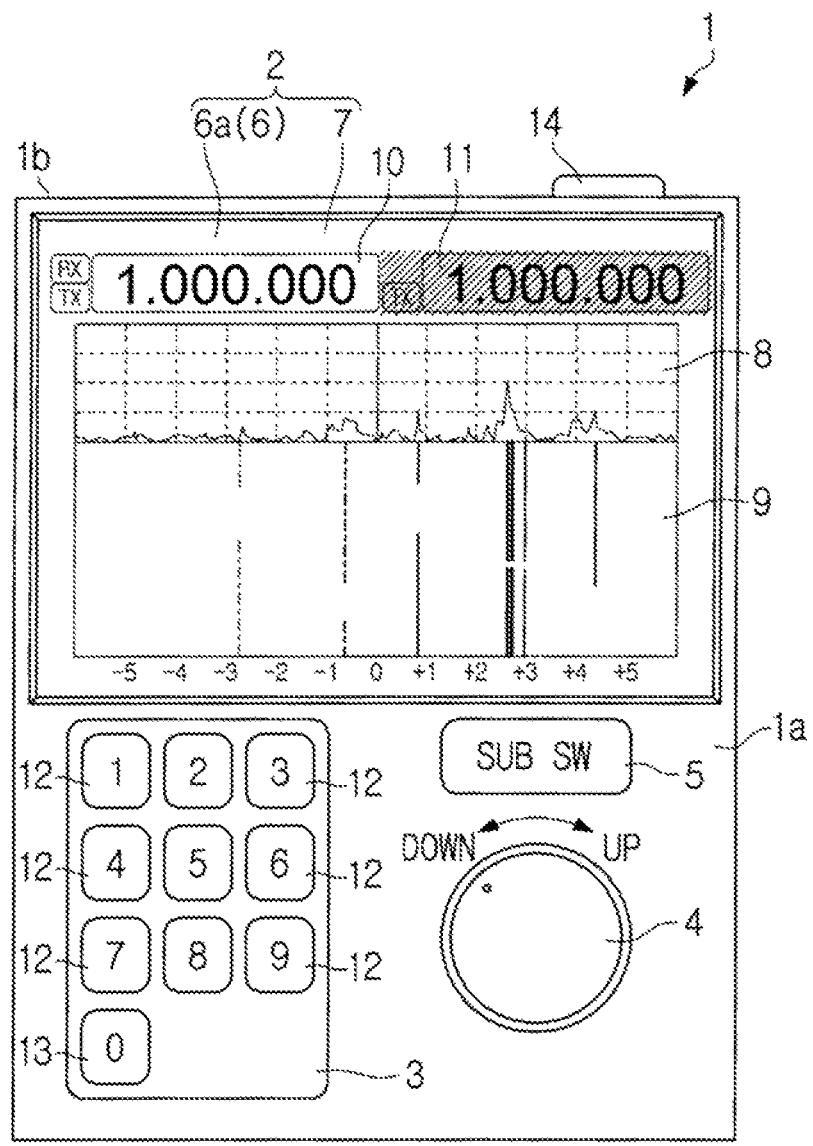
FIG. 1 is a front view of a wireless transceiver (first embodiment)

The attached drawings for illustrating exemplary embodiments of the present invention are referred to in order to gain a sufficient understanding of the present invention, the merits thereof, and the objectives accomplished by the implementation of the present invention. Hereinafter, the present invention will be described in detail by explaining exemplary embodiments of the invention with reference to the attached drawings. Like reference numerals in the drawings denote like elements.

First Embodiment

Hereinafter, a first embodiment of the present invention will be described with reference to FIGS. 1 through 18.

In the current specification, a "general operation" is an operation for performing wireless transmission and reception with a counterpart station, wherein a reception frequency and a transmission frequency are the same. A "split operation" is an operation for performing wireless transmission and reception with a counterpart station, wherein a reception frequency and a transmission frequency are different from each other. An "operating frequency" means a reception frequency and a transmission frequency. A "split frequency" means a transmission frequency of a self station when the self station is a call station and a counterpart station is a DX station. A "spectrum waveform display form" is a display form wherein a frequency distribution of signal strength in a predetermined frequency range including a predetermined operating frequency is displayed by setting a horizontal axis as a frequency and a vertical axis as signal strength. A "waterfall display form" is a display form wherein a frequency distribution of signal strength in a predetermined frequency range including a predetermined operating frequency is displayed by setting a horizontal axis as a frequency and a vertical axis as a time, wherein the signal strength is expressed in colors. Here, the horizontal axis and the vertical axis may be suitably changed.

Wireless transmission and reception with a counterpart station according to a general operation will be described in the first part of the present embodiment, and wireless transmission and reception with a DX station as a counterpart station according to a split operation will be described in the last part of the present embodiment.

FIG. 1 is a front view of a wireless transceiver 1 according to the present embodiment. A display unit 2, a numeric keypad 3 (an input unit), a frequency adjusting knob 4, and a split frequency setting button 5 are arranged on a front surface 1a of the wireless transceiver 1.

The display unit 2 is configured by overlapping a liquid crystal display (LCD) 6 having a display screen 6a, and a touch panel 7. As shown in FIG. 1, the display screen 6a of the LCD 6 includes a spectrum region 8 wherein a frequency distribution of signal strength in a predetermined frequency range including a predetermined operating frequency is displayed in a spectrum waveform display form, a waterfall region 9 wherein the frequency distribution of the signal strength is displayed in a waterfall display form, a reception frequency region 10 displaying a reception frequency, and a transmission frequency region 11 displaying a transmission frequency. Also, FIG. 1 shows a display example during a general operation, and thus the reception frequency displayed on the reception frequency region 10 and the transmission frequency displayed on the transmission frequency region 11 are the same, and the transmission frequency region 11 is displayed in a darker color tone than the reception frequency region 10. This is because, since the reception frequency and the transmission frequency are always the same during the general operation, the transmission frequency region 11 may not be referred to.

The numeric keypad 3 is an input unit for selectively receiving 1-9 number information corresponding to number information of any one of one through nine, and non 1-9 number information corresponding to information other than the number information of one through nine. The numeric keypad 3 includes nine nonzero keys 12 printed on key tops thereof and respectively having numbers from one through nine, and one zero key 13 printed on a key top thereof and having a number zero. When any one of the nonzero keys 12 is pressed, the 1-9 number information corresponding to the pressed nonzero key 12 is input. Also, when the zero key 13 is pressed, the non 1-9 number information is input. In the present embodiment, the non 1-9 number information is number information of zero, but alternatively, symbol information, such as "-" or "*" may be used.

The frequency adjusting knob 4 is a knob for finely adjusting the reception frequency or the transmission frequency. In the present embodiment, the reception or transmission frequency is increased when the frequency adjusting knob 4 is rotated clockwise. Similarly, the reception or transmission frequency is decreased when the frequency adjusting knob 4 is rotated counterclockwise.

The split frequency setting button 5 is a trigger button for starting a split operation. The split frequency setting button 5 includes a light emitting diode (LED), and may be lighted on or out according to a control of a control unit 20 described later.

A power supply switch 14 is arranged on a top surface 1b of the wireless transceiver 1.

Figure 2:
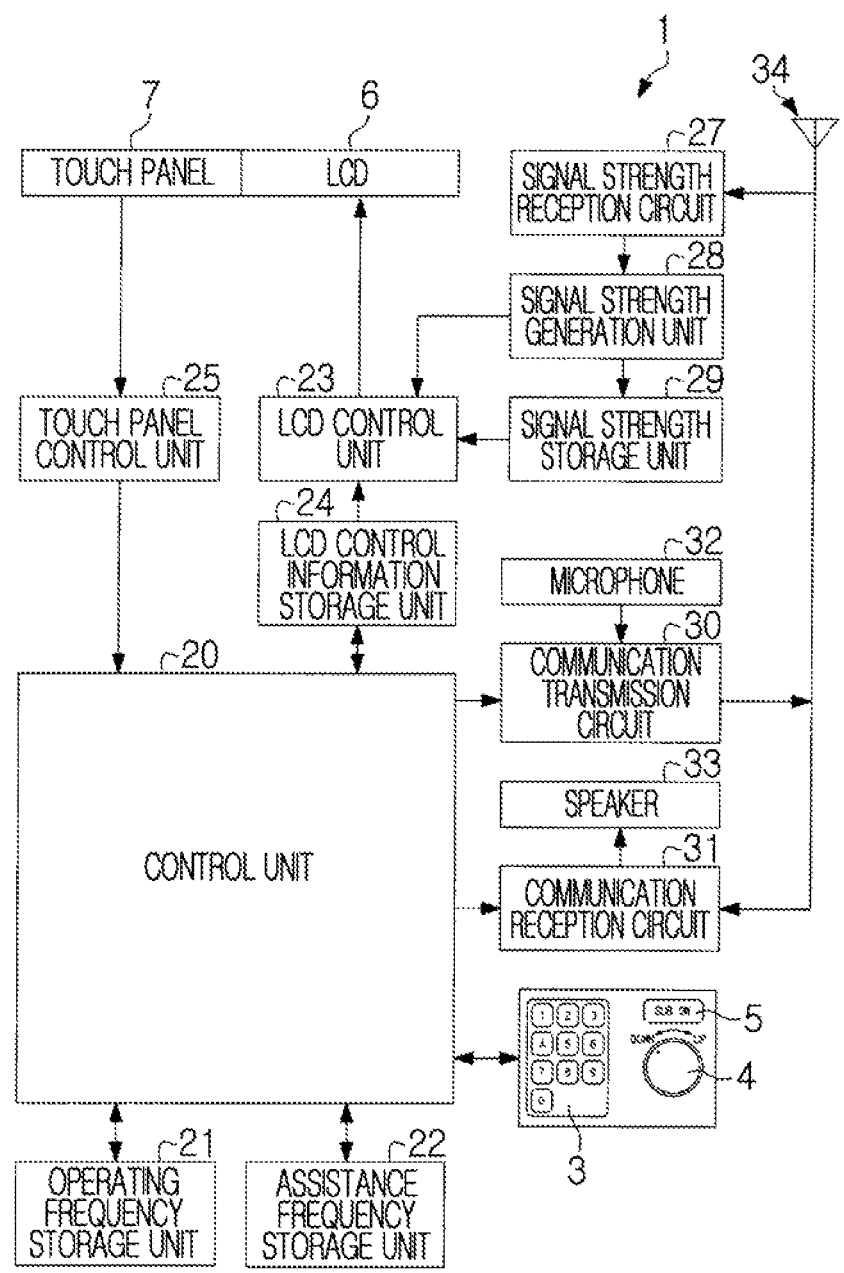
FIG. 2 is a functional block diagram of a wireless transceiver (first embodiment)

An electric configuration of the wireless transceiver 1 will now be described with reference to FIG. 2.

The wireless transceiver 1 further includes the control unit 20 (an update unit), an operating frequency storage unit 21 (a frequency information storage unit), an assistance frequency storage unit 22 (an assistance frequency information storage unit), an LCD control unit 23 (a display control unit), an LCD control information storage unit 24, a touch panel control unit 25, a signal strength reception circuit 27, a signal strength generation unit 28, a signal strength storage unit 29, a communication transmission circuit 30, and a communication reception circuit 31. A microphone 32, a speaker 33, and an antenna 34 are included as peripheral devices of the wireless transceiver 1. In the present embodiment, a manipulation detection unit is realized by the touch panel 7 and the touch panel control unit 25.

The operating frequency storage unit 21 is a storage unit for storing reception frequency information corresponding to the reception frequency and transmission frequency information corresponding to the transmission frequency. The operating frequency storage unit 21 is connected to the control unit 20.

The assistance frequency storage unit 22 is a storage unit for temporarily storing the reception frequency information stored in the operating frequency storage unit 21. The assistance frequency storage unit 22 is connected to the control unit 20.

The LCD control unit 23 is a control unit for controlling the LCD 6.

The LCD control information storage unit 24 is a storage unit for storing control information being referred to when the LCD control unit 23 controls the LCD 6. The LCD control information storage unit 24 stores an upper value and a lower value of a horizontal axis of the spectrum region 8 or waterfall region 9 of the display screen 6a of the LCD 6. The LCD control information storage unit 24 is connected to the control unit 20.

The touch panel control unit 25 is a control unit for controlling the touch panel 7. The touch panel control unit 25 generates coordinate information corresponding to a manipulation location of a contact manipulation of a user on the touch panel 7 and outputs the generated coordinate information and manipulation state information to the control unit 20, on the basis of a signal from the touch panel 7. The manipulation state information includes information about starting of the contact manipulation, information about the midst of the contact manipulation, and information about ending of the contact manipulation.

The signal strength reception circuit 27 is a circuit for receiving a signal from the antenna 34. The signal strength reception circuit 27 outputs the signal received from the antenna 34 to the signal strength generation unit 28.

The signal strength generation unit 28 generates frequency distribution information corresponding to the frequency distribution of the signal strength of the reception signal by analyzing the reception signal received from the signal strength reception circuit 27. The signal strength generation unit 28 outputs the generated frequency distribution information to the signal strength storage unit 29 and the LCD control unit 23.

The signal strength storage unit 29 stores the frequency distribution information input from the signal strength generation unit 28. The signal strength storage unit 29 stores a plurality of pieces of frequency distribution information in time series up to the present time, for example, from 20 seconds prior to the present time.

The LCD control unit 23 controls the LCD 6 so that the frequency distribution of the signal strength of the reception signal is displayed in the spectrum waveform display form on the spectrum region 8, on the basis of the frequency distribution information input from the signal strength generation unit 28. Similarly, the LCD control unit 23 controls the LCD 6 so that the frequency distribution of the signal strength of the reception signal is displayed in the waterfall display form on the waterfall region 9 by suitably referring to the signal strength storage unit 29.

The communication transmission circuit 30 is a transmission circuit for performing wireless transmission through the antenna 34 by using the transmission frequency corresponding to the transmission frequency information output from the operating frequency storage unit 21. The microphone 32 as a voice input unit is connected to the communication transmission circuit 30.

The communication reception circuit 31 is a reception circuit for performing wireless reception through the antenna 34 by using the reception frequency corresponding to the reception frequency information output from the operating frequency storage unit 21. The speaker 33 as a voice output unit is connected to the communication reception circuit 31.

The numeric keypad 3, the frequency adjusting knob 4, and the split frequency setting button 5 are connected to the control unit 20.

(Operations)

Operations of the wireless transceiver 1 will now be described. First, operations during the generation operation will be described with reference to FIG. 3, and operations during the split operation will be described with reference to FIGS. 4 and 5.

Figure 3:
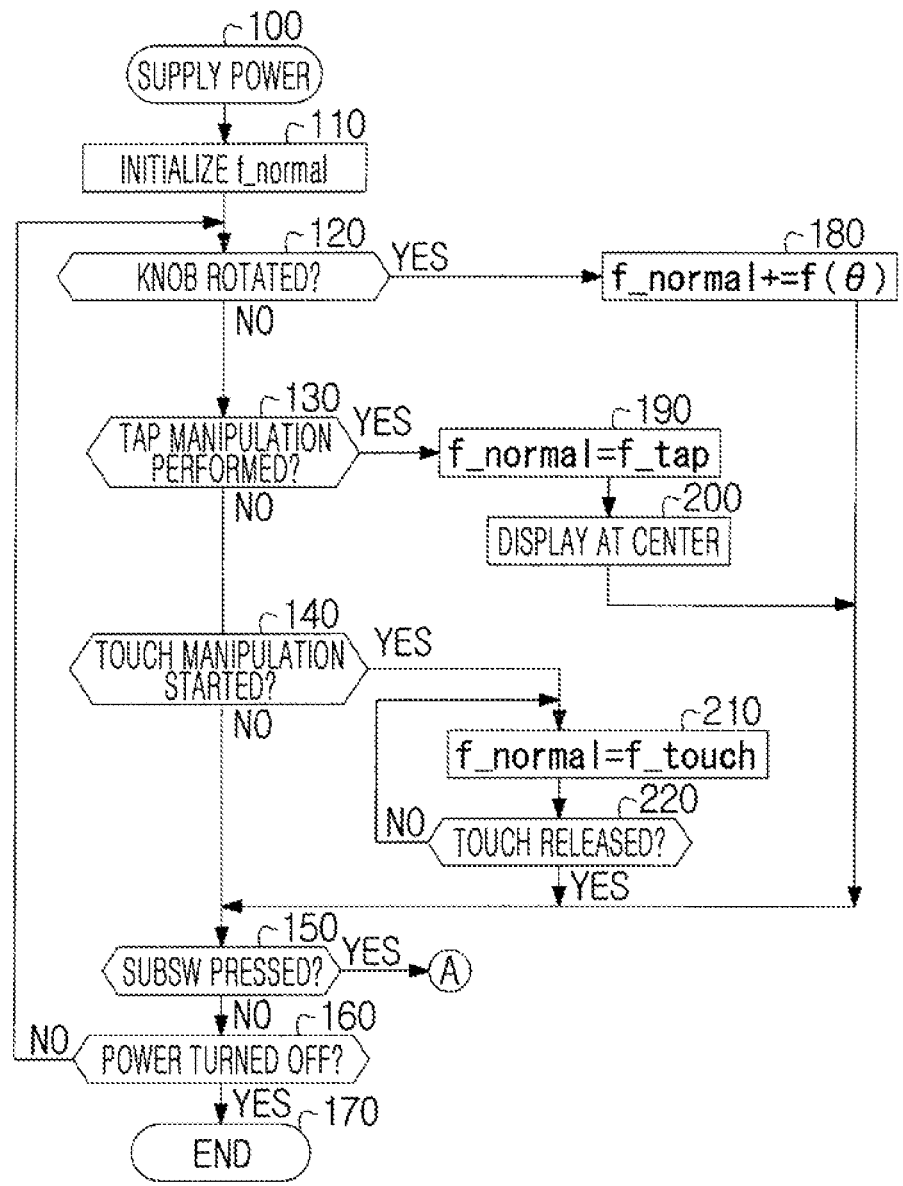
FIG. 3 is a flowchart showing a method of controlling a wireless transceiver during a general operation (first embodiment)
Figure 6:
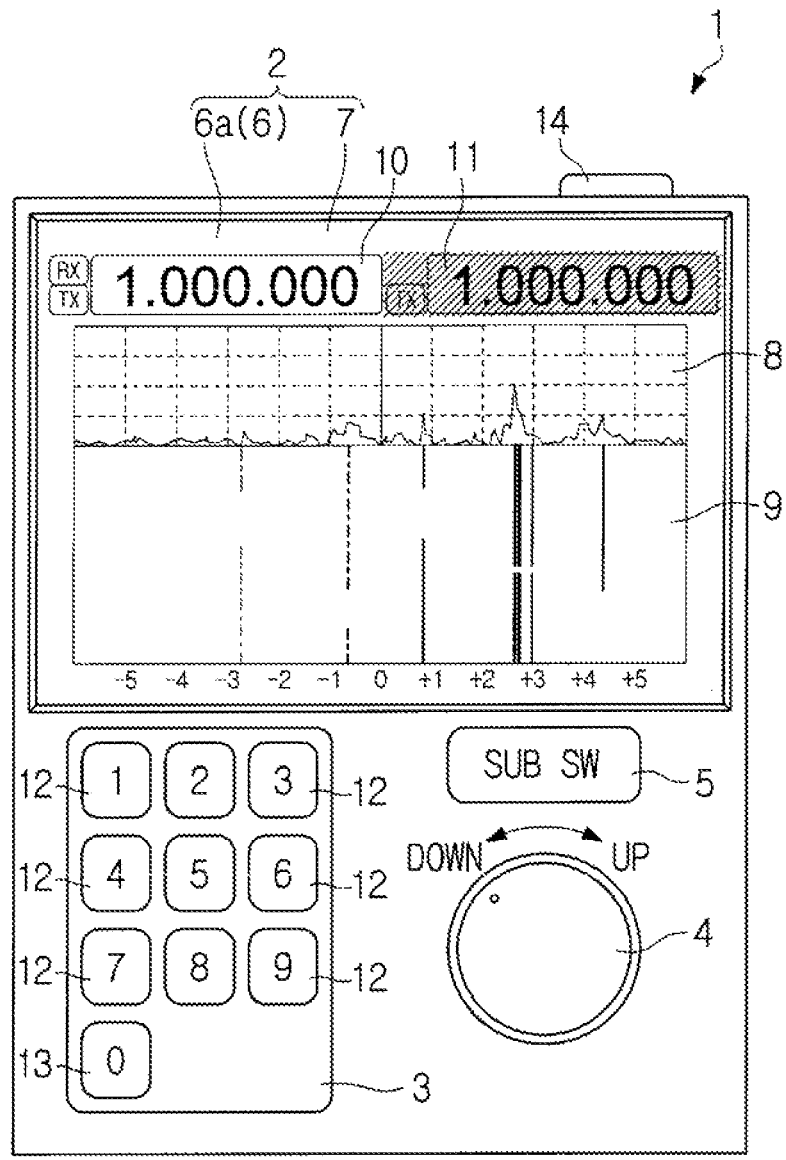
FIG. 6 is a front view of a wireless transceiver during a general operation (first embodiment)

In FIG. 3, power is supplied to the wireless transceiver 1 by pressing the power supply switch 14 (operation S100). Then, the control unit 20 initializes operating frequency information f_normal during the general operation (operation S110). FIG. 6 shows an initial screen immediately after power is supplied to the wireless transceiver 1. Here, the operating frequency information f_normal is set to 1 MHz. Next, the control unit 20 determines whether the frequency adjusting knob 4 has been rotated (operation S120). When it is determined that the frequency adjusting knob 4 has not been rotated in operation S120 (S120: No), the control unit 20 determines whether a tap manipulation has been performed on the touch panel 7 (operation S130). When it is determined that the tap manipulation has not been performed on the touch panel 7 in operation S130 (S130: No), the control unit 20 determines whether a touch manipulation has started on the touch panel 7 (operation S140). When it is determined that the touch manipulation has not started on the touch panel 7 in operation S140 (S140: No), the control unit 20 determines whether the split frequency setting button 5 is pressed (operation S150). When it is determined that the split frequency setting button 5 is not pressed in operation S150 (S150: No), the control unit 20 determines whether the power supply switch 14 is pressed (operation S160). When it is determined that the power supply switch 14 is pressed in operation S160 (S160: Yes), the control unit 20 ends a process (operation S170). When it is determined that the power supply switch 14 is not pressed in operation S160 (S160: No), the control unit 20 returns the process back to operation S120.

Figure 7:
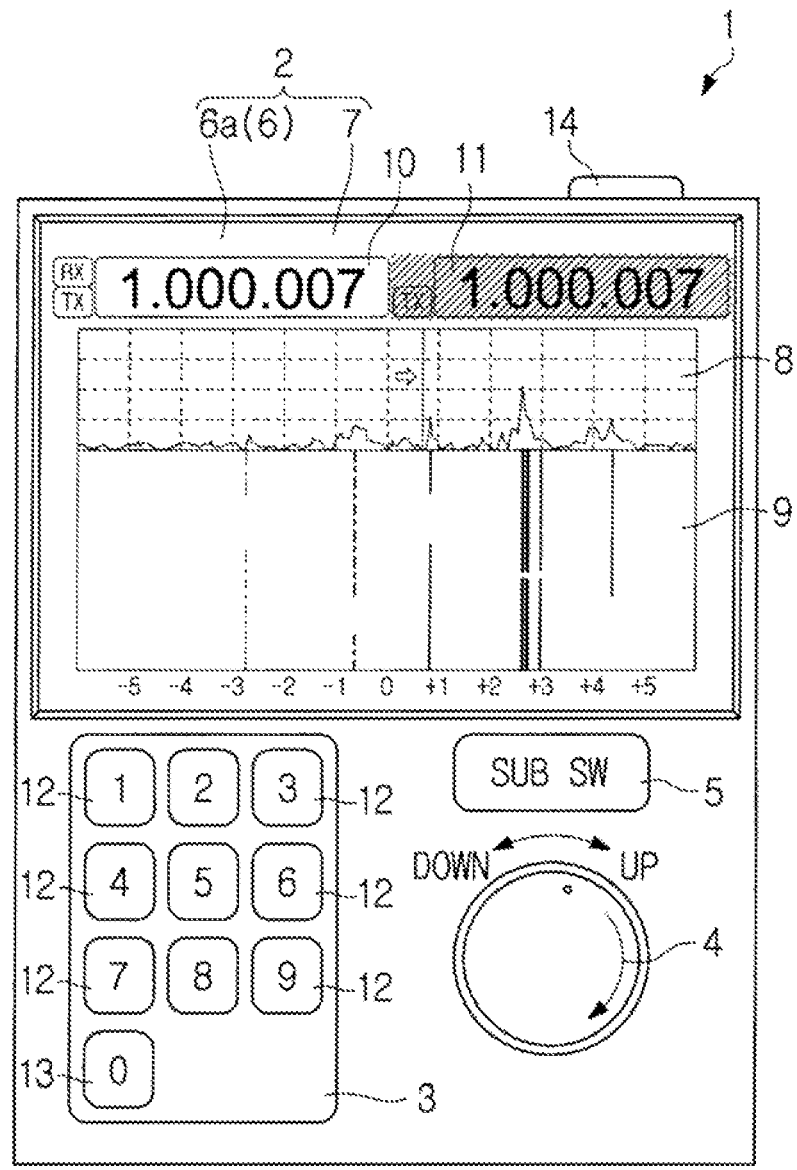
FIG. 7 is a front view of a wireless transceiver for describing a tuning manipulation using a frequency adjusting knob (first embodiment)

When it is determined that the frequency adjusting knob 4 has been rotated as shown in FIG. 7 in operation S120 (S120: Yes), the control unit 20 adds or subtracts frequency information $f(\theta)$ corresponding to a rotation angle $\theta$ of the frequency adjusting knob 4 to or from the present operating frequency information f_normal, and stores the operating frequency information f_normal after addition or subtraction in the operating frequency storage unit 21 (operation S180), and proceeds the process to operation S150. In an example of FIG. 7, the frequency adjusting knob 4 is slightly rotated clockwise, and thus the operating frequency information f_normal is changed from 1 MHz to 1.000007 MHz.

Figure 8:
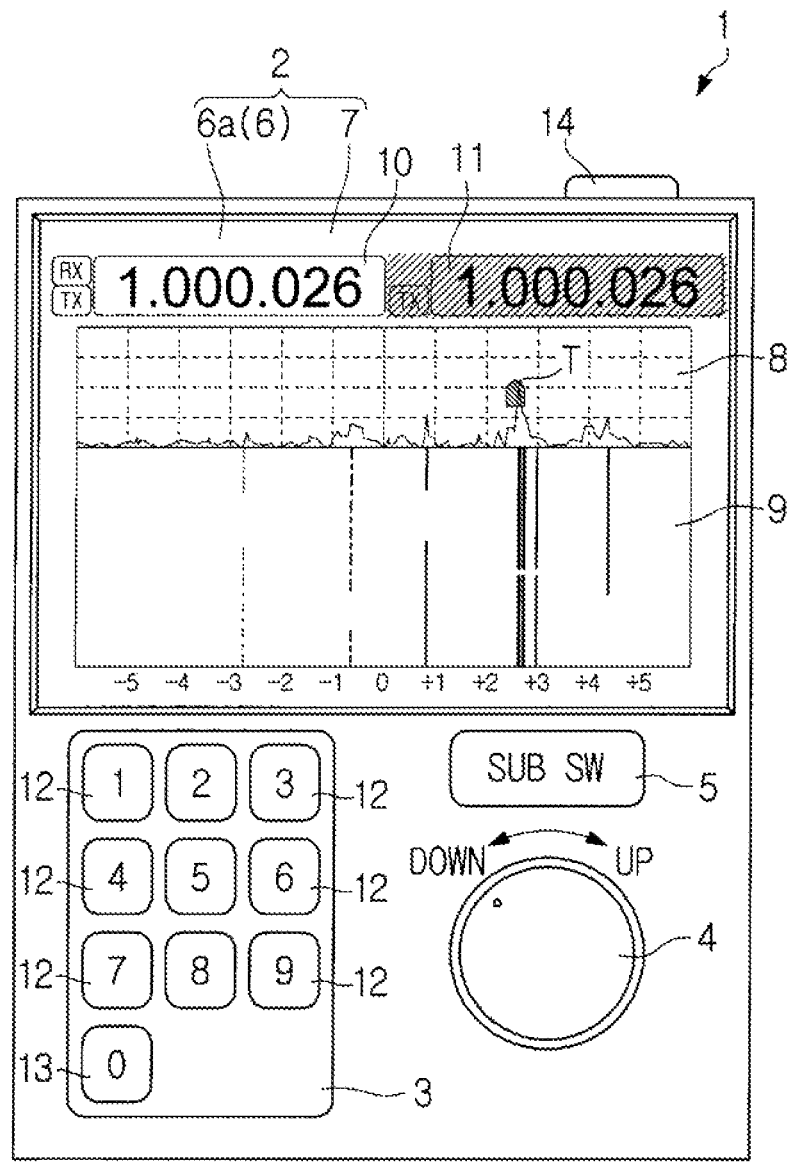
FIG. 8 is a front view of a wireless transceiver for describing a tuning manipulation using a touch panel (first embodiment)
Figure 9:
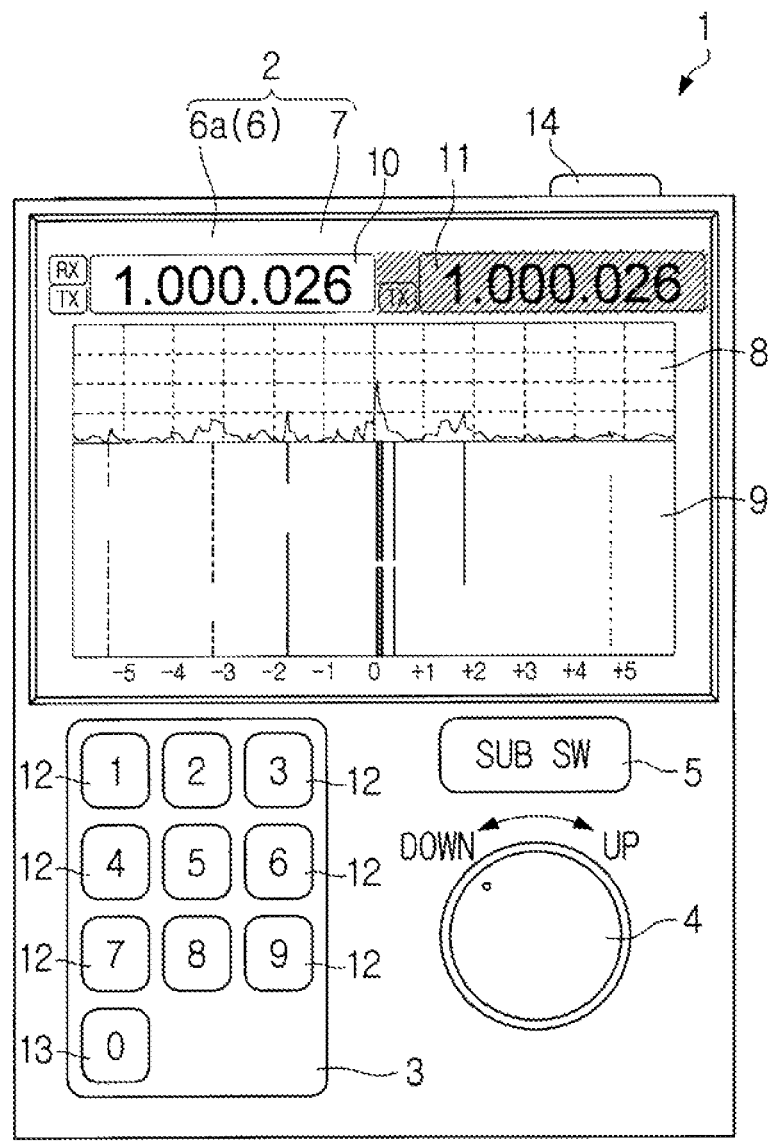
FIG. 9 is a front view of a wireless transceiver for describing a tuning manipulation using a touch panel (first embodiment)

When it is determined that the tap manipulation has been performed on the touch panel 7 as denoted by a sign "T" in FIG. 8 in operation S130 (S130: Yes), the control unit 20 obtains frequency information f_tap corresponding to a manipulation location of the tap manipulation based on coordinate information from the touch panel control unit 25 and upper and lower values read from the LCD control information storage unit 24, and stores the obtained frequency information f_tap in the operating frequency storage unit 21, as the operating frequency information f_normal (operation S190). Then, the LCD control unit 23 controls the LCD 6 such that a frequency corresponding to the operating frequency information f_normal after an update is approximately at a center of the display screen 6a of the LCD 6 (operation S200). In an example of FIG. 9, the operating frequency information f_normal is set to 1.000026 MHz, and display details of the LCD 6 is scrolled to the left of the space such that 1.000026

MHz is approximately at the center of the display screen 6a of the LCD 6. Then, the control unit 20 proceeds the process to operation S150.

When it is determined that the touch manipulation has started on the touch panel 7 in operation S140 (S140: Yes), the control unit 20 obtains frequency information f_touch corresponding to a manipulation location of the touch manipulation based on coordinate information from the touch panel control unit 25 and upper and lower values read from the LCD control information storage unit 24, and stores the obtained frequency information f_touch in the operating frequency storage unit 21, as the operating frequency information f_normal (operation S210). Then, the control unit 20 determines whether the touch manipulation on the touch panel 7 has ended (operation S220). When it is determined that the touch manipulation on the touch panel 7 has not ended (S220: No), the control unit 20 returns the process to operation S210. When it is determined that the touch manipulation on the touch panel 7 has ended (S220: Yes), the control unit 20 proceeds the process to operation S150. Accordingly, when the user performs a drag manipulation on the touch panel 7, the operating frequency information f_normal constantly changes following the drag manipulation. It is necessarily required that both of the drag manipulation, which is based on the touch manipulation, and the tap manipulation are possible.

When it is determined that the split frequency setting button 5 is pressed in operation S150 (S150: Yes), the control unit 20 proceeds the process to operation S300 of FIG. 4. Here, the split operation will now be described. First, the user manipulates the touch panel 7 or the frequency adjusting knob 4 so as to adjust the operating frequency to a transmission frequency of the counterpart station (DX station) as shown in FIG. 3. Here, the touch panel 7 is suitable for a rough adjustment of a tuning manipulation and the frequency adjusting knob 4 is suitable for a fine adjustment of a tuning manipulation. Then, based on an instruction of the counterpart station, a transmission frequency of the self station, i.e., a split frequency, is started to be set. Accordingly, the split frequency setting button 5 is pressed at a time when setting of the split frequency is started.

When it is determined that the split frequency setting button 5 is pressed in operation S150 of FIG. 3 (S150: Yes), the control unit 20 lights on the split frequency setting button 5 (operation S300). Then, the control unit 20 temporarily stores current reception frequency information f_RX in the assistance frequency storage unit 22, as restoration reception frequency information oldf_RX for restoration (operation S310). At this time, the user changes the current reception frequency information f_RX (operation S320). Then, the control unit 20 determines again whether the split frequency setting button 5 is pressed (operation S330). When it is determined that the split frequency setting button 5 is not pressed in operation S330 (S330: No), the control unit 20 returns the process to operation S320. On the other hand, when it is determined that the split frequency setting button 5 is pressed in operation S330, the control unit 20 copies the current reception frequency information f_RX to transmission frequency information f_TX (operation S340), restores the reception frequency information f_RX by using the restoration reception frequency information oldf_RX (operation S350), and lights out the split frequency setting button 5 (operation S360) to determine whether the power supply switch 14 is pressed (operation S370). When it is determined that the power supply switch 14 is pressed (S370: Yes), the control unit 20 ends the process (operation S380).

Accordingly, in the present embodiment, while setting a split frequency, a usage situation of electric waves may be simply actually viewed, and an interference between a DX station and another station desiring wireless transmission and reception may be efficiently avoided. Also, since a reception frequency returns back to an original frequency before viewing after the split frequency is set, a call from the DX station is not missed.

Next, a process of changing the reception frequency information f_RX in operation S320 of FIG. 4 will be described with reference to FIG. 5 and FIGS. 10 through 18.

Figure 4:
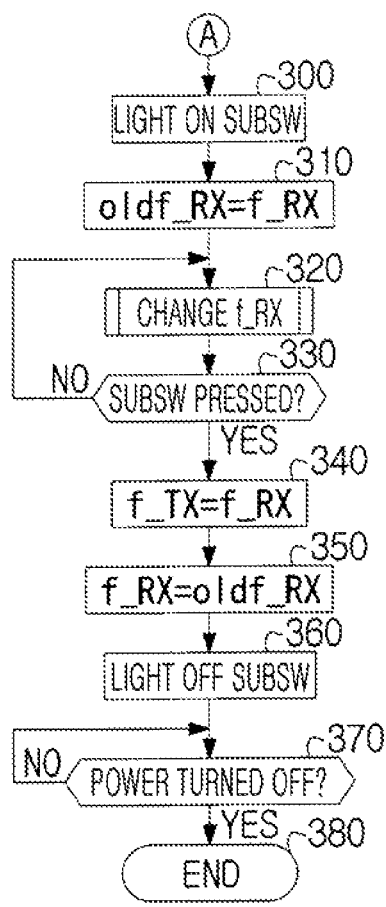
FIG. 4 is a flowchart showing a method of controlling a wireless transceiver during a split operation (first embodiment)
Figure 10:
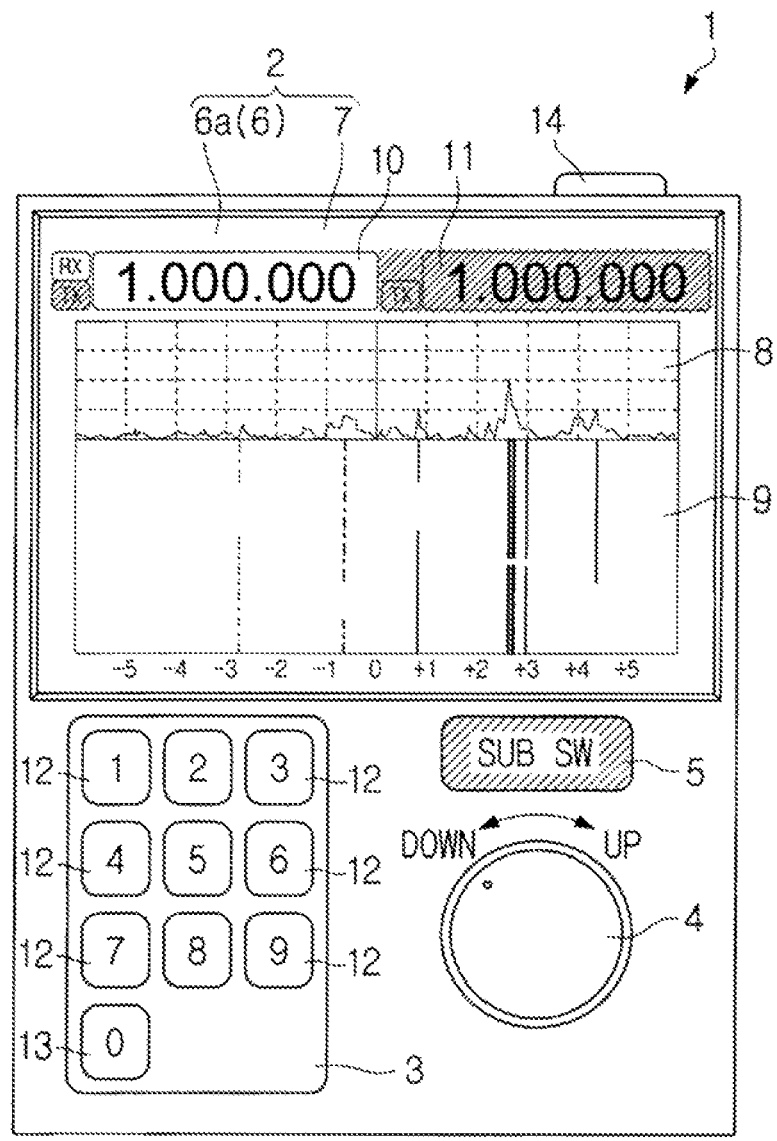
FIG. 10 is a front view of a wireless transceiver during a split operation (first embodiment)

FIG. 10 shows a state at a point in time when the process is shifted from operation S310 to operation S320 in FIG. 4. In operation S320, as shown in FIG. 10, the split frequency setting button 5 is lighted on.

Figure 5:
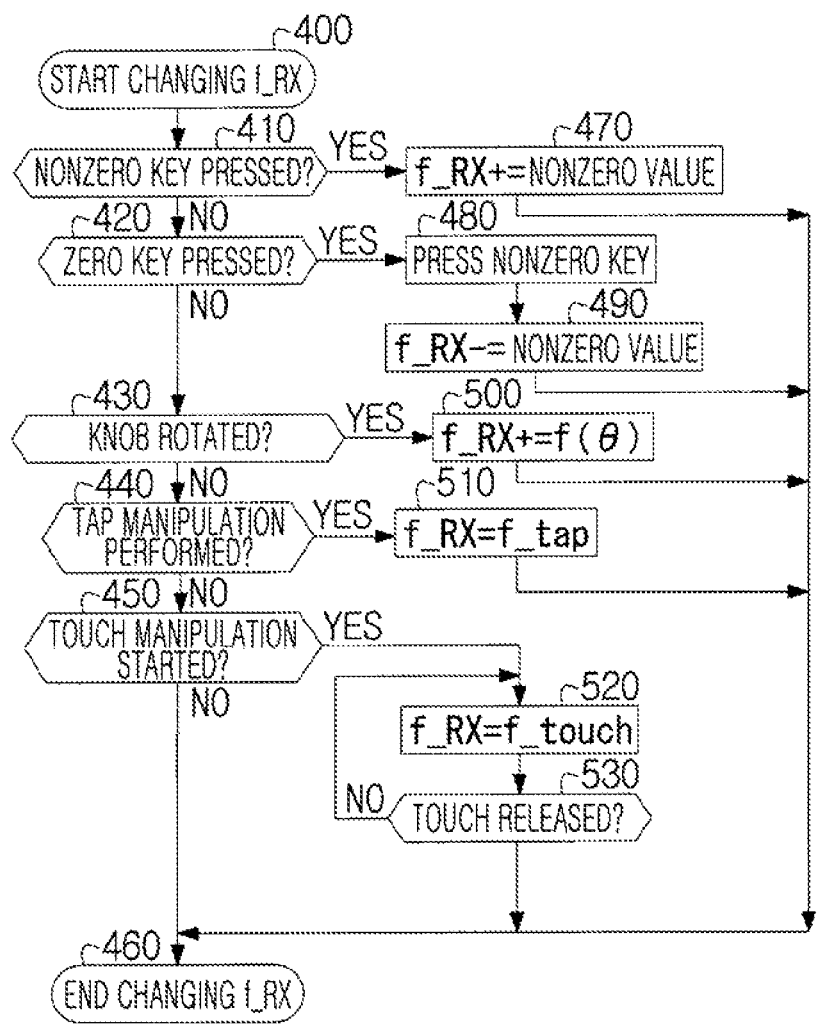
FIG. 5 is a flowchart showing a method of controlling a wireless transceiver while setting a split frequency (first embodiment)

In FIG. 5, when changing of the reception frequency information f_RX starts (operation S400), the control unit 20 determines whether any nonzero key 12 is pressed (operation S410). When it is determined that none of the nonzero keys 12 is pressed in operation S410 (S410: No), the control unit 20 determines whether the zero key 13 is pressed (S420). When it is determined that the zero key 13 is not pressed in operation S420 (S420: No), the control unit 20 determines whether the frequency adjusting knob 4 has been rotated (S430). When it is determined that the frequency adjusting knob 4 has not been rotated in operation S430 (S430: No), the control unit 20 determines whether a tap manipulation has been performed on the touch panel 7 (S440). When it is determined that the tap manipulation has not been performed on the touch panel 7 in operation S440 (S440: No), the control unit 20 determines whether a touch manipulation has started on the touch panel 7 (S450). When it is determined that the touch manipulation has not started on the touch panel 7 in operation S450 (S450: No), the control unit 20 proceeds the process to operation S330 of FIG. 4 (S460).

Figure 11:
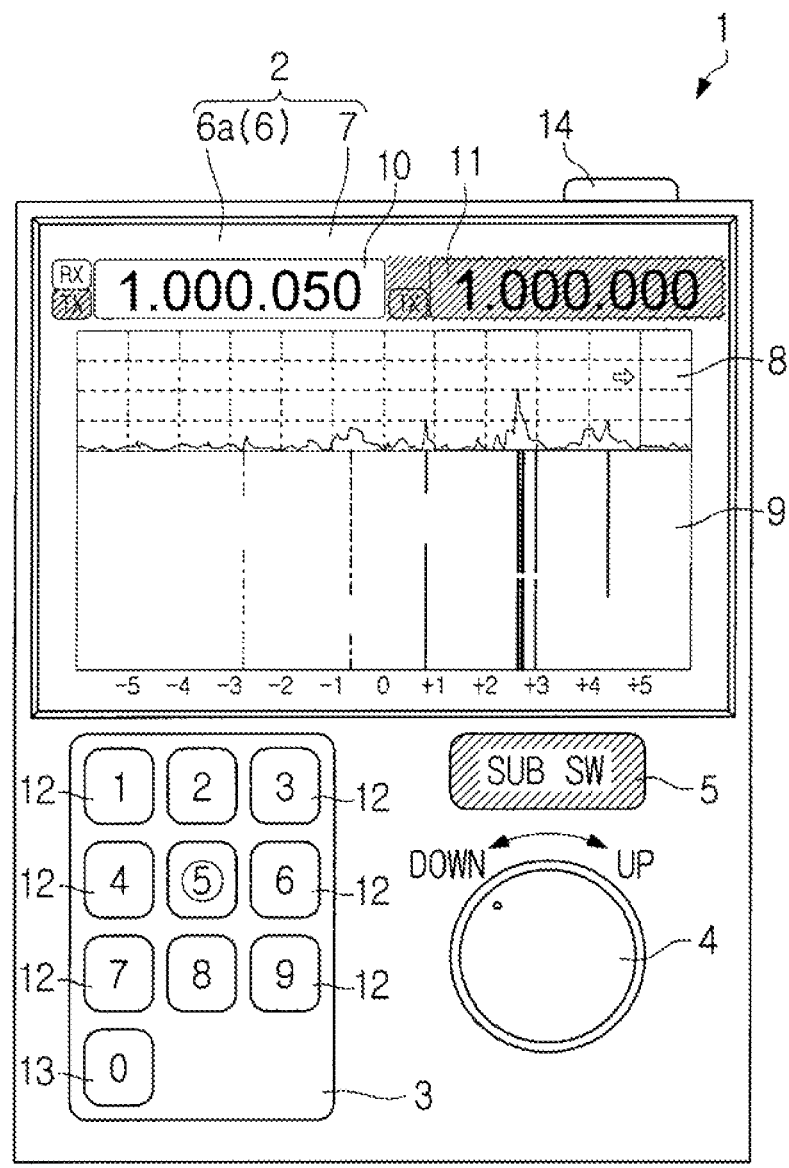
FIG. 11 is a front view of a wireless transceiver for describing setting a split frequency by using a numeric keypad (first embodiment)
Figure 12:
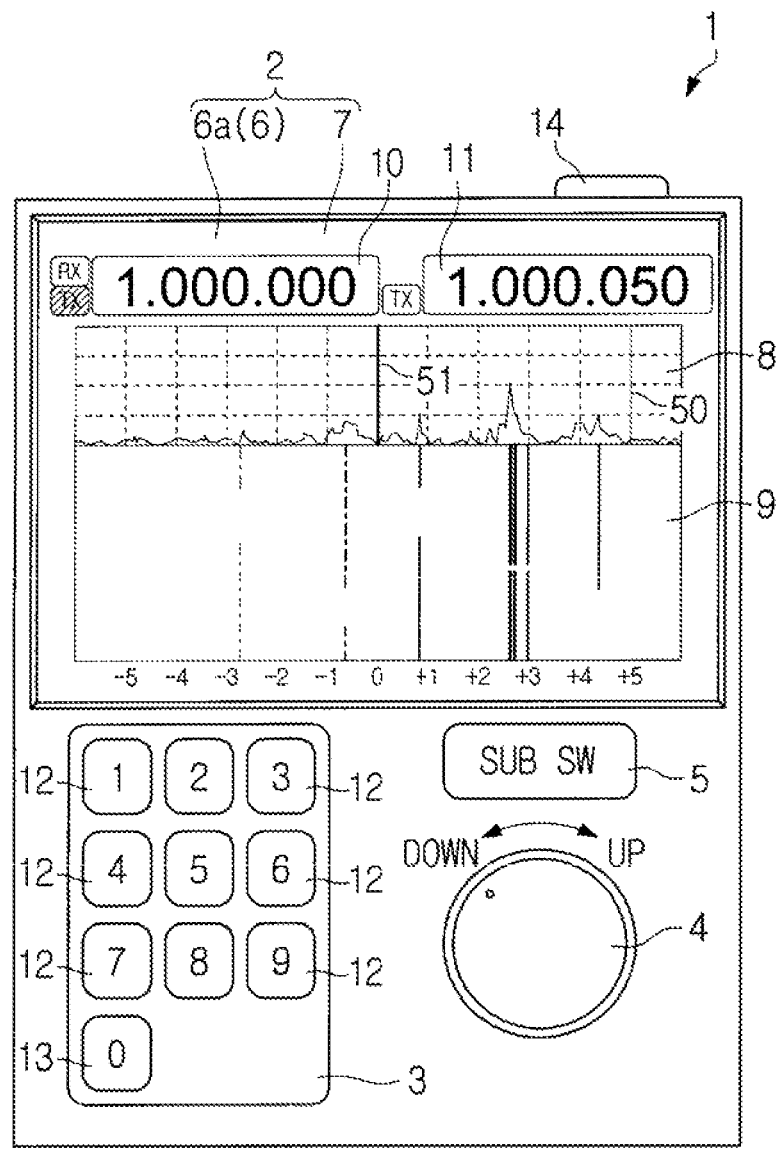
FIG. 12 is a front view of a wireless transceiver for describing a determined state of setting of a split frequency (first embodiment)

As shown in FIG. 11, when it is determined that any nonzero key 12 is pressed in operation S410 (S410: Yes), the control unit 20 adds a nonzero value corresponding to the pressed nonzero key 12 to the reception frequency information f_RX, stores the reception frequency information f_RX after addition in the operating frequency storage unit 21 (S470), and proceeds the process to operation S460. Referring to an example of FIG. 11, since the nonzero key 12 on which "5" is printed is pressed, the control unit 20 adds 5×10=50 Hz to the reception frequency information f_RX. Also, when the nonzero key 12 on which "5" is printed is pressed, the control unit 20 may suitably determine whether to add 5 Hz, 50 Hz, or 500 Hz to the reception frequency information f_RX, i.e., a digit of the reception frequency information f_RX for adding "5". At this time, when the split frequency setting button 5 is pressed (S330: Yes), the control unit 20, as shown in FIG. 12, copies the current reception frequency information f_RX (1.000050 MHz) to the transmission frequency information f_TX (S340), and restores the reception frequency information f_RX by using the restoration reception frequency information oldf_RX (1.000000 MHz (S350). In FIG. 12, a thin vertical bar 50 in the spectrum region 8 denotes a split frequency, and a thick vertical bar 51 denotes a reception frequency.

Figure 13:
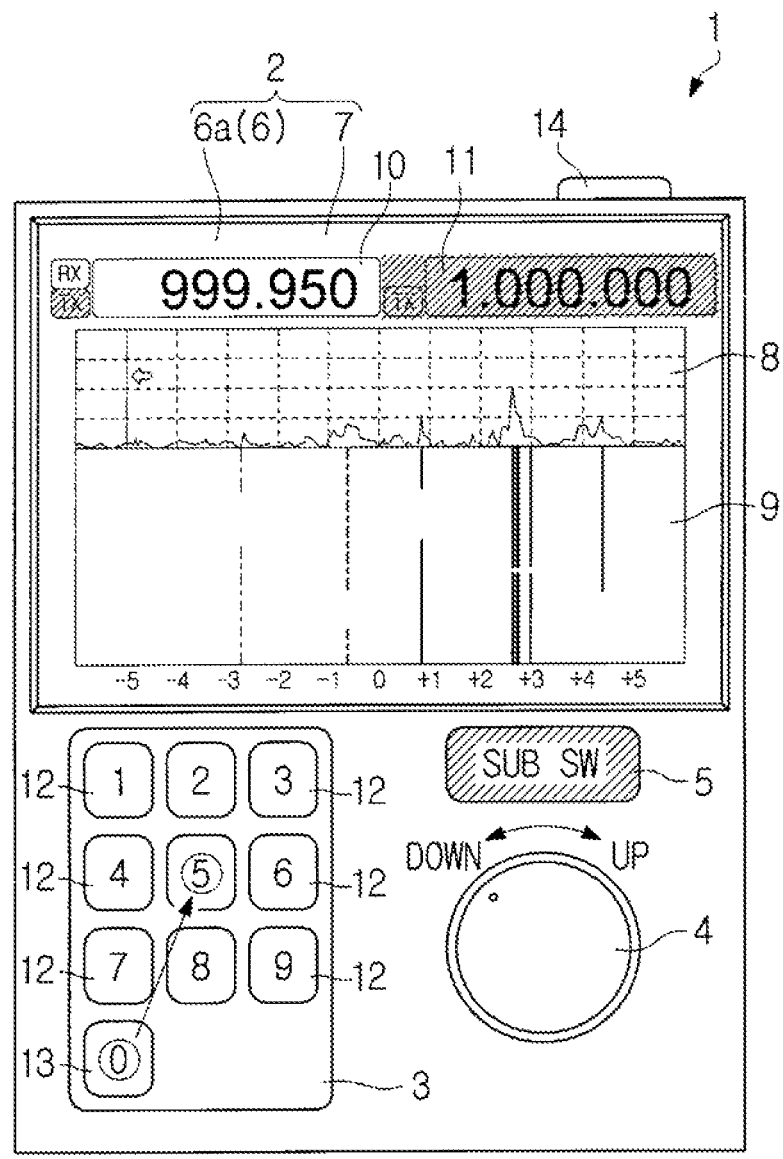
FIG. 13 is a front view of a wireless transceiver for describing setting of a split frequency by using a numeric keypad (first embodiment)
Figure 14:
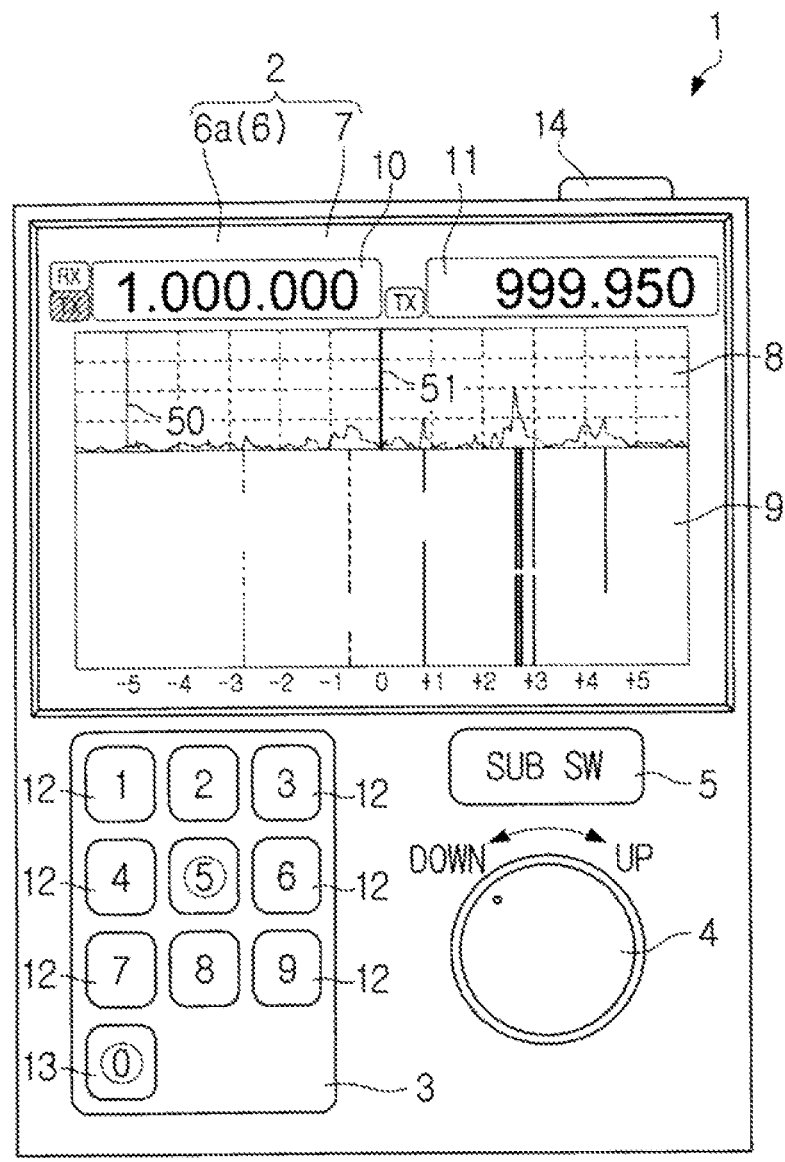
FIG. 14 is a front view of a wireless transceiver for describing a determined state of setting of a split frequency (first embodiment)

As shown in FIG. 13, when it is determined that the zero key 13 is pressed in operation S420 (S420: Yes), the control unit 20 stands by for the nonzero key 12 to be pressed (S480). When any nonzero key 12 is pressed (S480), the control unit 20 subtracts a nonzero value corresponding to the pressed nonzero key 12 from the reception frequency information f_RX, stores the reception frequency information f_RX after subtraction in the operating frequency storage unit 21 (S490), and proceeds the process to operation S460. In an example of FIG. 13, since the nonzero key 12 on which "5" is printed is pressed after the zero key 13 on which "0" is printed is pressed, the control unit 20 subtracts 5×10=50 Hz from the reception frequency information f_RX. Also, when the nonzero key 12 on which "5" is printed is pressed, the control unit 20 may suitably determine whether to subtract 5 Hz, 50 Hz, or 500 Hz from the reception frequency information f_RX, i.e., a digit of the reception frequency information f_RX from which "5" is to be subtracted. At this time, when the split frequency setting button 5 is pressed (S330: Yes), the control unit 20, as shown in FIG. 14, copies the current reception frequency information f_RX (0.999950 MHz) to the transmission frequency information f_TX (S340), and restores the reception frequency information f_RX by using the restoration reception frequency information oldf_RX (1.000000 MHz) (S350).

Figure 15:
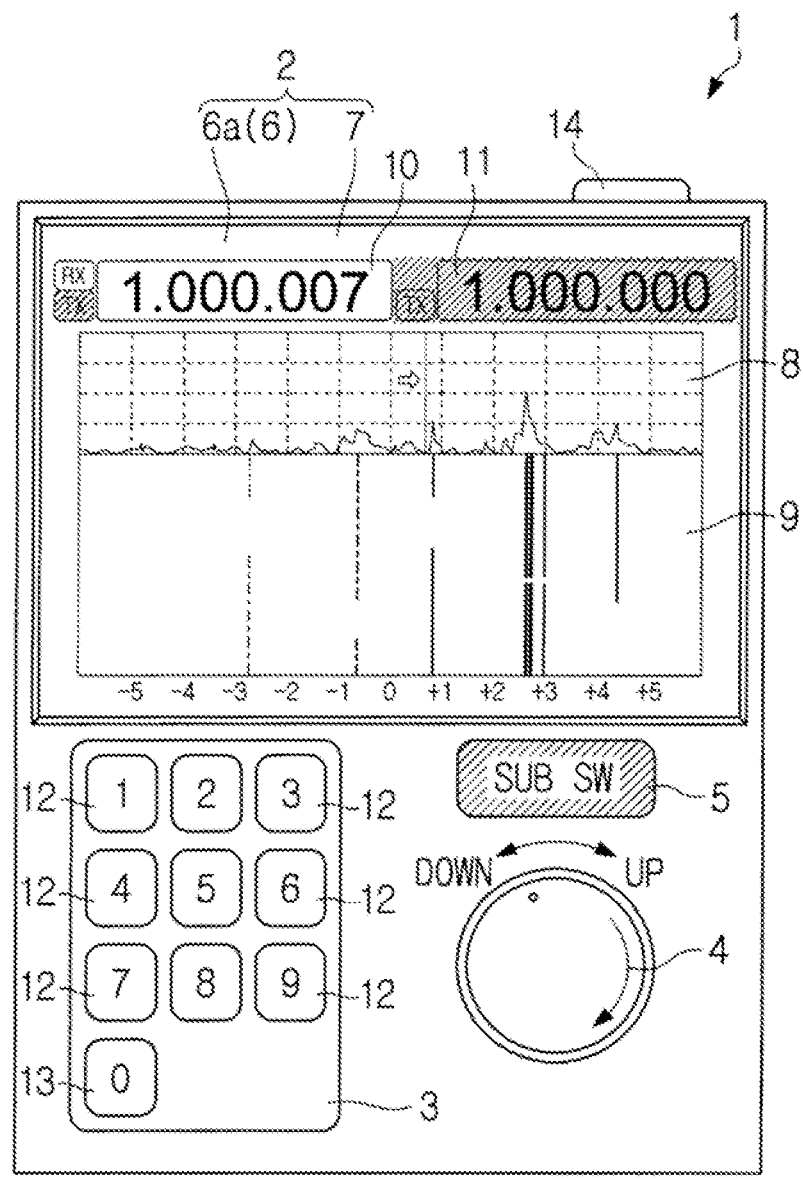
FIG. 15 is a front view of a wireless transceiver for describing setting a split frequency by using a knob (first embodiment)
Figure 16:
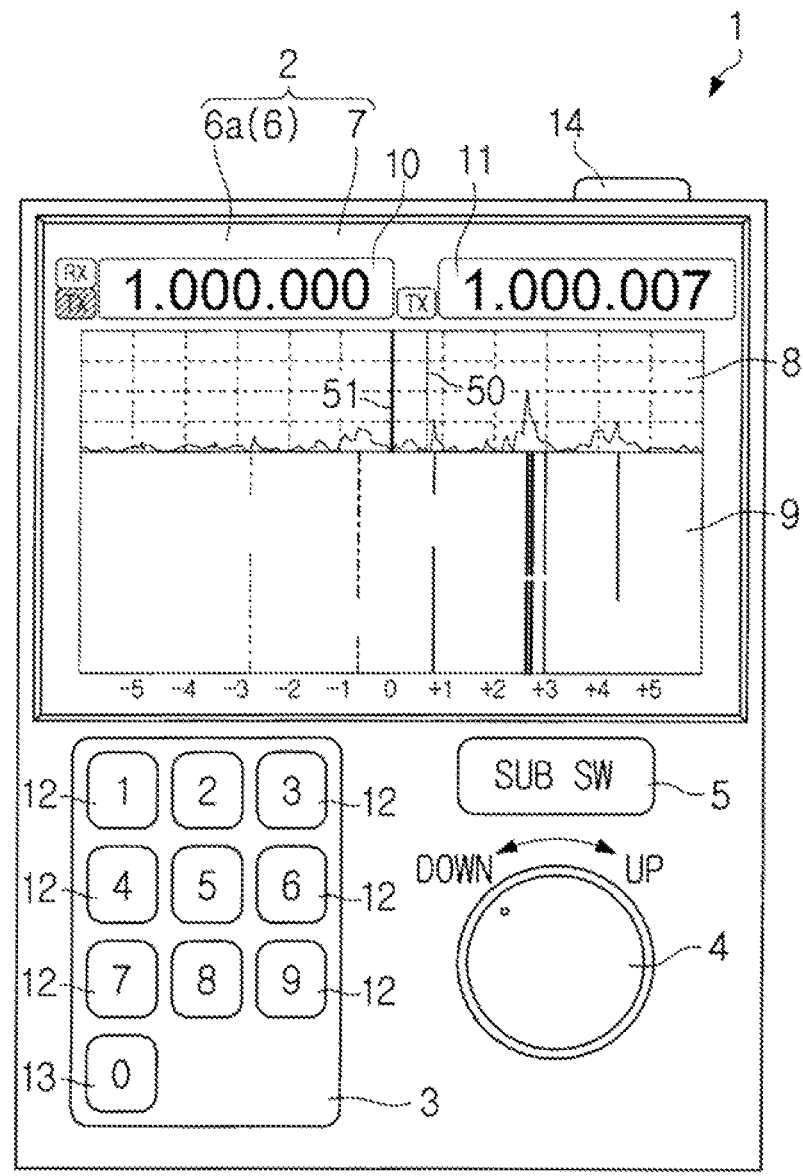
FIG. 16 is a front view of a wireless transceiver for describing a determined state of setting a split frequency (first embodiment)
Figure 17:
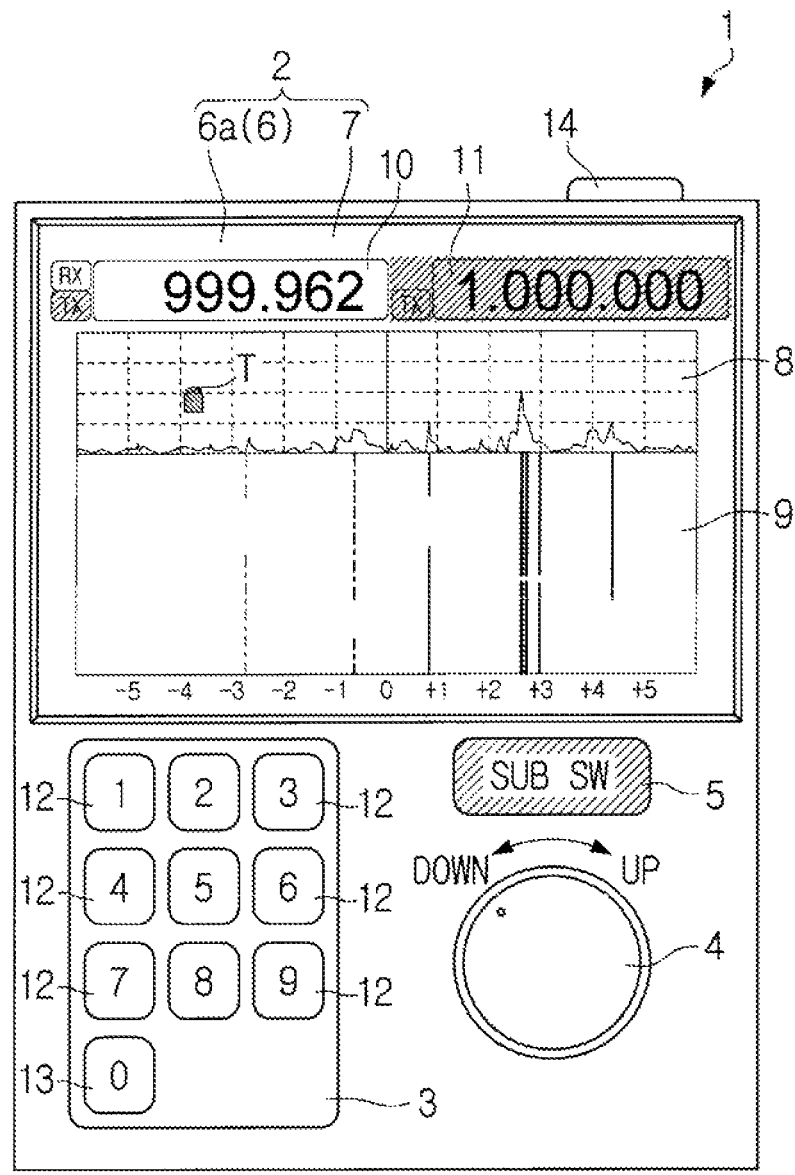
FIG. 17 is a front view of a wireless transceiver for describing setting a split frequency by using a touch panel (first embodiment)

As shown in FIG. 15, when it is determined that the frequency adjusting knob 4 has been rotated in operation S430 (S430: Yes), the control unit 20 adds or subtracts the frequency information f(θ) corresponding to the rotation angle θ of the frequency adjusting knob 4 to or from the current reception frequency information f_RX, stores the reception frequency information f_RX after addition or subtraction in the operating frequency storage unit 21 (S500), and proceeds the process to operation S460. In an example of FIG. 15, the reception frequency information f_RX is changed from 1 MHz to 1.000007 MHz by slightly rotating the frequency adjusting knob 4 clockwise. At this time, when the split frequency setting button 5 is pressed (S330: Yes), the control unit 20, as shown in FIG. 16, copies the current reception frequency information f_RX (1.000007 MHz) to the transmission frequency information f_TX (S340), and restores the reception frequency information f_RX by using the restoration reception frequency information oldf_RX (1.000000 MHz) (S350).

Figure 18:
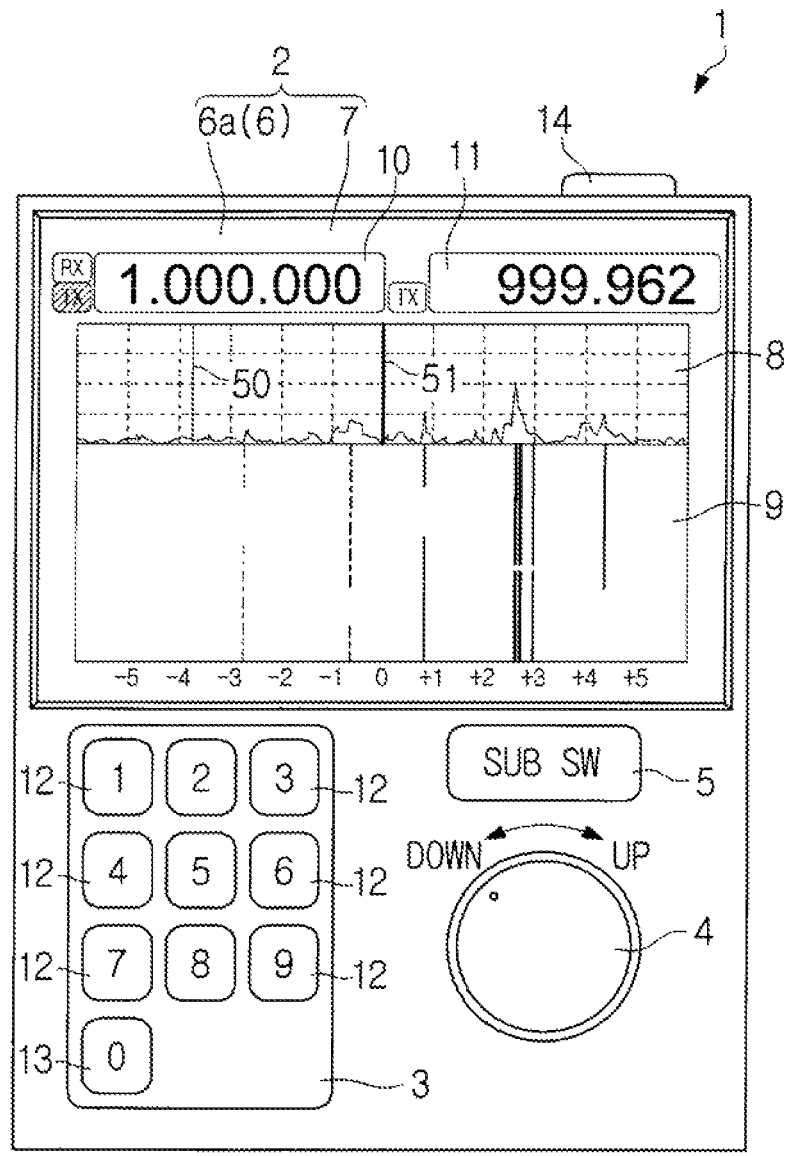
FIG. 18 is a front view of a wireless transceiver for describing a determined state of setting a split frequency (first embodiment)

When it is determined that the tap manipulation has been performed on the touch panel 7 in operation S440 (S440: Yes), as denoted by a sign "T" in FIG. 17, the control unit 20 obtains the frequency information f_tap corresponding to the manipulation location of the tap manipulation based on the coordinate information from the touch panel control unit 25 and the upper and lower values read from the LCD control information storage unit 24, stores the obtained frequency information f_tap as the reception frequency information f_RX in the operating frequency storage unit 21 (S510), and proceeds the process to operation S460. In an example of FIG. 17, the reception frequency information f_RX is changed from 1 MHz to 0.999962 MHz. At this time, when the split frequency setting button 5 is pressed (S330: Yes), the control unit 20, as shown in FIG. 18, copies the current reception frequency information f_RX (0.999962 MHz) to the transmission frequency information f_TX (S340), and restores the reception frequency information f_RX by using the restoration reception frequency information oldf_RX (1.000000 MHz) (S350).

When it is determined that the touch manipulation has started on the touch panel 7 in operation S450 (S450: Yes), the control unit 20 obtains the frequency information f_touch corresponding to the manipulation location of the touch manipulation based on the coordinate information from the touch panel control unit 25 and the upper and lower values read from the LCD control information storage unit 24, and stores the obtained frequency information f_touch as the reception frequency information f_RX in the operating frequency storage unit 21 (S520). Then, the control unit 20 determines whether the touch manipulation on the touch panel 7 has ended (S530). When it is determined that the touch manipulation on the touch panel 7 has not ended (S530: No), the control unit 20 returns the process to operation S520. When it is determined that the touch manipulation on the touch panel 7 has ended (S530: Yes), the control unit 20 proceeds the process to operation S460. Accordingly, when the user performs the drag manipulation on the touch panel 7, the reception frequency information f_RX constantly changes following the drag manipulation.

Hereinabove, the first embodiment of the present invention has been described. The first embodiment has the following strong points.

(1-1) The wireless transceiver 1 includes the LCD 6 (a display unit) including the display screen 6a, the LCD control unit 23 (a display control unit) for controlling the LCD 6 to display a frequency distribution of signal strength of a received signal on the display screen 6a, the touch panel 7 and the touch panel control unit 25 (a manipulation detection unit) for detecting a manipulation of the user on the display screen 6a, the operating frequency storage unit 21 (a frequency information storage unit) for storing the reception frequency information corresponding to the reception frequency and the transmission frequency information corresponding to the transmission frequency, the control unit 20 (an update unit) for updating the reception frequency information stored in the operating frequency storage unit 21 or the transmission frequency information stored in the operating frequency storage unit 21 based on frequency information corresponding to a manipulation location of a manipulation detected by the touch panel 7 and the touch panel control unit 25, and the communication transmission circuit 30 and the communication reception circuit 31 (a wireless transmission reception unit) for performing wireless transmission and reception based on the reception frequency information stored in the operating frequency storage unit 21 and the transmission frequency information stored in the operating frequency storage unit 21. Accordingly, an operating frequency in the wireless transceiver 1 may be conveniently adjusted.

(1-2) Also, the LCD control unit 23 controls the LCD 6 to display the frequency distribution on the display screen 6a in a spectrum waveform display form or a waterfall display form. Specifically, when the frequency distribution is displayed in a waterfall display form, a past situation of electric waves may be determined, and thus a setting according to purposes may be possible.

In other words, the tap manipulation and the touch manipulation may be performed not only on the spectrum region 8 but also on the waterfall region 9. In a half-duplex communication, a signal may not be detected at a current point in time, and even in a frequency where the signal is not detected at the current point in time, a frequency at which the signal was previously detected may be selected.

(1-3) Also, the LCD control unit 23 controls the LCD 6 such that a frequency corresponding to a manipulation location is approximately at the center of the display screen 6a.

(1-4) Also, a manipulation of the user on the LCD 6 is a contact manipulation on the display screen 6a.

(1-5, 1-6) Also, when the contact manipulation starts, the control unit 20 updates the reception frequency information stored in the operating frequency storage unit 21 based on a manipulation location of the contact manipulation, and when the split frequency setting button 5 is pressed after the contact manipulation has ended, copies the reception frequency information stored in the operating frequency storage unit 21 to the transmission frequency information stored in the operating frequency storage unit 21. Accordingly, while setting a transmission frequency in a split operation, a usage situation of electric waves may be simply and actually viewed.

Alternatively, when the contact manipulation starts, the control unit 20 may update the reception frequency information stored in the operating frequency storage unit 21 based on the manipulation location of the contact manipulation, and when the split frequency setting button 5 is pressed after the contact manipulation has ended, may update the transmission frequency information stored in the operating frequency storage unit 21 based on the manipulation location of the contact manipulation instead of copying the reception frequency information stored in the operating frequency storage unit 21 to the transmission frequency information stored in the operating frequency storage unit 21.

(1-7, 1-8) Also, the wireless transceiver 1 further includes the assistance frequency storage unit 22 (an assistance frequency information storage unit) for storing the reception frequency information. When the contact manipulation is started, the control unit 20 preserves the reception frequency information, which is stored in the operating frequency storage unit 21 at the starting point, in the assistance frequency storage unit 22, and then updates the reception frequency information stored in the operating frequency storage unit 21 based on the manipulation location of the contact manipulation. When the split frequency setting button 5 is pressed after the contact manipulation has ended, the control unit 20 copies the reception frequency information stored in the operating frequency storage unit 21 to the transmission frequency information, and then restores the reception frequency information stored in the operating frequency storage unit 21 to a state before the contact manipulation by using the reception frequency information stored in the assistance frequency storage unit 22. Accordingly, difficulty in manually restoring a reception frequency after setting a transmission frequency may be reduced.

Alternatively, when the split frequency setting button 5 is pressed after the contact manipulation has ended, the control unit 20 may update the transmission frequency information stored in the operating frequency storage unit 21 based on the manipulation location of the contact manipulation, and then restore the reception frequency information stored in the operating frequency storage unit 21 to a state before the contact manipulation by using the reception frequency information stored in the assistance frequency storage unit 22, instead of copying the reception frequency information stored in the operating frequency storage unit 21 to the transmission frequency information and then restoring the reception frequency information stored in the operating frequency storage unit 21 to the state before the contact manipulation by using the reception frequency information stored in the assistance frequency storage unit 22.

(1-9) Also, during the contact manipulation, the control unit 20 updates the reception frequency information stored in the operating frequency storage unit 21 by using the manipulation location of the contact manipulation. Accordingly, the reception frequency constantly changes following the drag manipulation.

(1-10) Also, the user manipulates the display screen 6a on which the frequency distribution of the signal strength of the received signal is displayed (S130 and S140), updates the reception frequency information corresponding to the reception frequency based on the frequency information corresponding to the manipulation location of the manipulation (S190 and S210), and performs wireless transmission and reception based on the reception frequency information.

(2-1) The wireless transceiver 1 performs wireless transmission and reception by using the reception frequency and the transmission frequency different from the reception frequency. The wireless transceiver 1 includes the operating frequency storage unit 21 for storing the reception frequency information corresponding to the reception frequency and the transmission frequency information corresponding to the transmission frequency, the numeric keypad 3 (an input unit) into which the 1-9 number information corresponding to number information from one to nine is selectively input, the control unit 20 for updating the transmission frequency information stored in the operating frequency storage unit 21 based on the reception frequency information stored in the operating frequency storage unit 21 and the 1-9 number information input by the numeric keypad 3, and the communication transmission circuit 30 and the communication reception circuit 31 (a wireless transmission and reception unit) for performing wireless transmission and reception by using the reception frequency stored in the operating frequency storage unit 21 and the transmission frequency stored in the operating frequency storage unit 21. Accordingly, a split frequency by a call station may be simply set during the split operation.

(2-2) Also, the control unit 20 updates the transmission frequency information to frequency information obtained by adding the number information corresponding to the 1-9 number information input by the numeric keypad 3 to the reception frequency information f_RX stored in the operating frequency storage unit 21.

(2-3) Also, the numeric keypad 3 is configured to input the non 1-9 number information corresponding to information other than the 1-9 number information. When the non 1-9 number information is input and then the 1-9 number information is input by the numeric keypad 3, the control unit 20 updates the transmission frequency information to the frequency information obtained by subtracting the number information corresponding to the 1-9 number information input by the numeric keypad 3 from the reception frequency information stored in the operating frequency storage unit 21. Accordingly, a frequency lower than the reception frequency information f_RX may be set as the transmission frequency via a simple manipulation.

(2-4) Also, the non 1-9 number information includes number information of "0".

(2-5) Also, in a method of setting a transmission frequency in the wireless transceiver 1 performing wireless transmission and reception by using a reception frequency and a transmission frequency different from the reception frequency, the method includes a first step of selectively inputting the 1-9 number information corresponding to any number information from among one through nine (S410), and a second step of setting the transmission frequency information f_TX based on the reception frequency information f_RX and the input 1-9 number information (S470 and S340). According to the method, a split frequency may be simply set by a call station.

(2-6) In the second step, the transmission frequency information f_TX is set to a frequency obtained by adding the number information corresponding to the input 1-9 number information to the reception frequency information f_RX.

(2-7) In the first step, the non 1-9 number information corresponding to information other than any number information from among one to nine is input (S420), and then the 1-9 number information is input (S480), and in the second step, the transmission frequency information f_TX is set to the frequency obtained by subtracting the number information corresponding to the input 1-9 number information from the reception frequency information f_RX (S490 and S340). According to the method, a frequency lower than the reception frequency information f_RX may be set as the transmission frequency information f_TX via a simple manipulation.

(2-8) The non 1-9 number information includes number information of "0".

Second Embodiment

Figure 19:
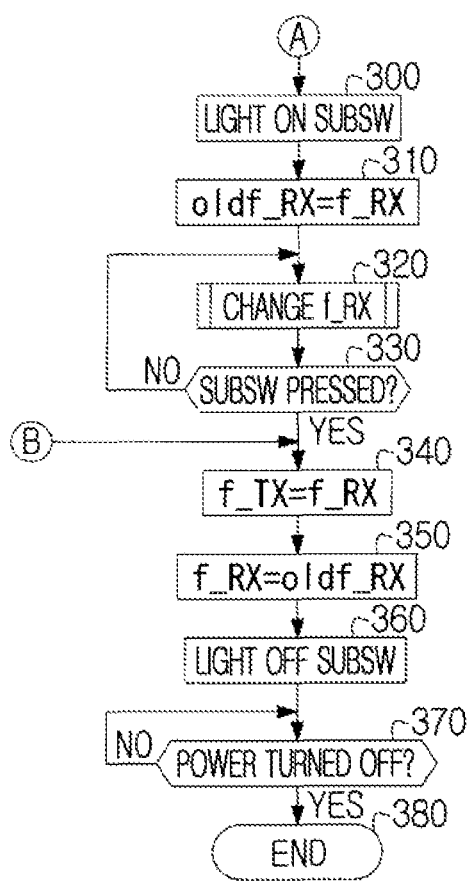
FIG. 19 is a flowchart showing a method of controlling a wireless transceiver during a split operation (second embodiment)
Figure 20:
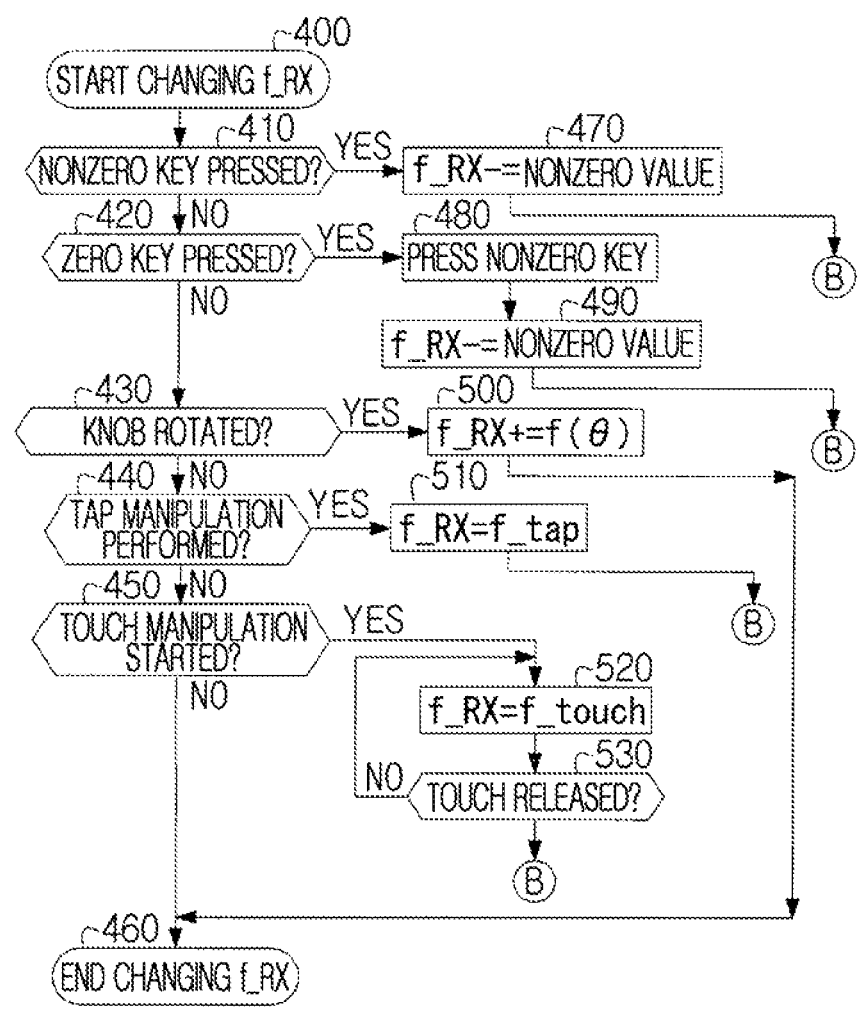
FIG. 20 is a flowchart showing a method of controlling a wireless transceiver while setting a split frequency (second embodiment).

Next, a second embodiment of the present invention will now be described with reference to FIGS. 19 and 20. Here, only differences between the present embodiment and the first embodiment will be mainly described, and overlapping details will be suitably omitted. Also, a component corresponding to each component of the first embodiment is denoted by the same reference numeral as a rule.

In the present embodiment, when the reception frequency information f_RX is changed in operation S320 and it is determined that the split frequency setting button 5 is pressed in operation S330, the changing of the reception frequency information f_RX is determined, and then processes after operation S340 are performed. However, in the current embodiment, as alternatively shown in FIGS. 19 and 20, when operations S470, S490, S510, and S530 are completed, the changing of the reception frequency information f_RX is determined and the processes after operation S340 are performed even if the split frequency setting button 5 is not pressed. Here, since the tap manipulation on the LCD 6 depends on a rough adjustment, when operation S500 is completed, the control unit 20 proceeds the process to operation S460 as in the first embodiment.

According to the present invention, convenience of adjusting an operating frequency in a wireless transceiver is improved.

While this invention has been particularly shown and described with reference to exemplary embodiments thereof, it will be understood by those skilled in the art that various changes in form and details may be made therein without departing from the spirit and scope of the invention as defined by the appended claims.

What is claimed is:

1. A wireless transceiver which performs transmission and reception in an operating frequency wherein a transmission frequency and a reception frequency are the same or different, wherein the wireless transceiver comprises:
    a display unit which has a display screen;
    a display control unit which controls the display unit to display on the display screen a frequency distribution of a signal strength in a predetermined frequency range including the operating frequency, the frequency distribution being a spectrum of the predetermined frequency range;
    a manipulation detection unit which detects a manipulation of a user on the display screen;
    a frequency information storage unit which stores reception frequency information corresponding to the reception frequency and transmission frequency information corresponding to the transmission frequency;
    an update unit which updates the reception frequency information stored in the frequency information storage unit or the transmission frequency information stored in the frequency information storage unit, on a basis of information about a frequency corresponding to a manipulation location of the manipulation detected by the manipulation detection unit; and
    a wireless transmission and reception unit which performs wireless transmission and reception, wherein the wireless reception is performed by using the reception frequency information stored in the frequency information storage unit and the wireless transmission is performed by using the transmission frequency information stored in the frequency information storage unit.

2. The wireless transceiver of claim 1, wherein the display control unit controls the display unit to additionally display on the display screen the frequency distribution of the signal strength in the predetermined frequency range, in a waterfall display form.

3. The wireless transceiver of claim 1, wherein the display control unit controls the display unit such that the frequency corresponding to the manipulation location is approximately at a center of the display screen.

4. The wireless transceiver of claim 1, wherein the manipulation is a contact manipulation on the display screen.

5. The wireless transceiver of claim 4, wherein the update unit updates the reception frequency information stored in the frequency information storage unit based on the manipulation location of the contact manipulation when the contact manipulation starts, and updates the transmission frequency information stored in the frequency information storage unit based on the manipulation location of the contact manipulation after the contact manipulation ends.

6. The wireless transceiver of claim 4, wherein the update unit updates the reception frequency information stored in the frequency information storage unit based on the manipulation location of the contact manipulation when the contact manipulation starts, and copies the reception frequency information stored in the frequency information storage unit to the transmission frequency information stored in the frequency information storage unit after the contact manipulation ends.

7. The wireless transceiver of claim 4, further comprising an assistance frequency information storage unit for storing the reception frequency information,
    wherein the update unit, when the contact manipulation starts, preserves the reception frequency information stored in the frequency information storage unit in the assistance frequency information storage unit and then updates the reception frequency information stored in the frequency information storage unit based on the manipulation location of the contact manipulation, and after the contact manipulation ends, updates the transmission frequency information stored in the frequency information storage unit based on the manipulation location of the contact manipulation and then restores the reception frequency information stored in the frequency information storage unit to a state before the contact manipulation by using the reception frequency information stored in the assistance frequency information storage unit.

8. The wireless transceiver of claim 4, further comprising an assistance frequency information storage unit for storing the reception frequency information,
    wherein the update unit, when the contact manipulation starts, preserves the reception frequency information stored in the frequency information storage unit in the assistance frequency information storage unit and then updates the reception frequency information stored in the frequency information storage unit based on the manipulation location of the contact manipulation, and after the contact manipulation ends, copies the reception frequency information stored in the frequency information storage unit to the transmission frequency information and then restores the reception frequency information stored in the frequency information storage unit to a state before the contact manipulation by using the reception frequency information stored in the assistance frequency information storage unit.

9. The wireless transceiver of claim 5, wherein the update unit updates the reception frequency information stored in the frequency information storage unit based on the manipulation location of the contact manipulation, during the contact manipulation.

10. A method of setting an operating frequency of a wireless transceiver which performs transmission and reception in the operating frequency, wherein a transmission frequency and a reception frequency are the same or different, the method comprising:
- manipulating, by a user, a display screen on which a frequency distribution of a signal strength in a predetermined frequency range including the operating frequency is displayed, the frequency distribution being a spectrum of the predetermined frequency range;
- updating the reception frequency or the transmission frequency based on a frequency corresponding to a manipulation location of the manipulating; and
- performing the reception in the updated reception frequency and the transmission in the updated transmission frequency.

11. The method of claim 10, wherein the frequency distribution of the signal strength in the predetermined frequency range is additionally displayed on the display screen in a waterfall display form.

* * * * *